(12) United States Patent
Kawabata (10) Patent No.: US 7,348,913 B2
(45) Date of Patent: Mar. 25, 2008

(54) ARBITRARY WAVEFORM GENERATOR, ARBITRARY WAVEFORM GENERATE METHOD, TESTING APPARATUS, AND PROGRAM (75) Inventor: Masayuki Kawabata, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/443,684

(22) Filed: May 31, 2006

(65) Prior Publication Data
US 2006/0273943 A1 Dec. 7, 2006

(30) Foreign Application Priority Data
Jun. 1, 2005 (JP) ............................. 2005-161212

(51) Int. Cl.
H03M 1/76 (2006.01)
(52) U.S. Cl. ...................... 341/148; 714/740
(58) Field of Classification Search ................ 341/148; 714/740, 724; 375/224
See application file for complete search history.

(56) References Cited

U.S. PATENT DOCUMENTS 6,687,868 B1 * 2/2004 Furukawa et al. .......... 714/740

* cited by examiner

Primary Examiner—Rexford Barnie
Assistant Examiner—Joseph Lauture
(74) Attorney, Agent, or Firm—Osha·Liang LLP (57) ABSTRACT There is provided an arbitrary waveform generator that generates an arbitrary waveform. The arbitrary waveform generator includes a waveform pattern generating section that generates pattern data showing a pattern of the arbitrary waveform, a digital-analog converting section that outputs the arbitrary waveform based on the pattern data, and a correction processing section that corrects the pattern data and inputs the corrected data into the digital-analog converting section based on a value made by differentiating the pattern data and a time constant of a path through which the arbitrary waveform output from the digital-analog converting section passes.

7 Claims, 8 Drawing Sheets

FIG. 1

FIG. 2A  ARBITRARY WAVEFORM

FIG. 2B  DIFFERENCE WAVEFORM

FIG. 2C  DERIVATIVE WAVEFORM

ARBITRARY WAVEFORM GENERATOR, ARBITRARY WAVEFORM GENERATE METHOD, TESTING APPARATUS, AND PROGRAM

CROSS REFERENCE TO RELATED APPLICATION

The present application claims priority from a Japanese Patent Application(s) No. 2005-161212 filed on Jun. 1, 2005, the contents of which are incorporated herein by reference.

BACKGROUND OF THE INVENTION

1. Field of the Invention

The present invention relates to an arbitrary waveform generator for generating a desired waveform and a testing apparatus including the arbitrary waveform generator. More particularly, the present invention relates to an arbitrary waveform generator for generating a waveform with small noises.

2. Related Art

When testing a device under test, a method for inputting a test signal having a desired waveform into the device under test has been conventionally known. For example, the good or bad of the device under test can be decided by comparing an output signal from the device under test when inputting this test signal with an expectation signal.

Conventionally, an arbitrary waveform generator has been used in order to generate a test signal with a desired waveform. This arbitrary waveform generator converts digital data showing a pattern of a waveform to be generated into an analog signal by means of a digital-analog converter (hereinafter, referred to as a DAC). Moreover, a high-frequency component of this analog signal is removed and thus a waveform of this analog signal is smoothened by means of a smoothing filter.

However, in the case of using a smoothing filter, a waveform of an analog signal is distorted if a band of this smoothing filter is narrow. For example, a test of an analog-digital converter (hereinafter, referred to as an ADC) requires a lamp wave having highly precise linearity. However, it is difficult that a lamp wave passing a smoothing filter guarantees linearity because a waveform of the lamp wave is distorted at a starting point and an end point of an edge of the wave.

Moreover, in the case of using a filter in order to remove noises from a test signal, the test signal may be similarly distorted. Moreover, when generating a high-frequency test signal, since an inclination of a test signal becomes steep, it is necessary to broaden bandwidth of a test circuit. When a band of a test circuit is not enough, a test signal is distorted. However, when broadening bandwidth of a test circuit, noises overlapped on a test signal increases. In this manner, in a conventional apparatus, it was difficult to generate a high-speed and low-noise test signal.

SUMMARY OF THE INVENTION

Therefore, it is an object of the present invention to provide an arbitrary waveform generator and a testing apparatus that can solve the foregoing problems. The above and other objects can be achieved by combinations described in the independent claims. The dependent claims define further advantageous and exemplary combinations of the present invention.

That is, according to the first aspect of the present invention, there is provided an arbitrary waveform generator that generates an arbitrary waveform. The arbitrary waveform generator includes: a waveform pattern generating section that generates pattern data showing a pattern of the arbitrary waveform; a digital-analog converting section that outputs the arbitrary waveform based on the pattern data; and a correction processing section that corrects the pattern data and inputs the corrected data into said digital-analog converting section based on a value made by differentiating the pattern data and a time constant of a path through which the arbitrary waveform output from said digital-analog converting section passes.

The correction processing section may include: a differential processing section that differentiates the pattern data; a multiplication section that multiplies the time constant by data output from said differential processing section; and an addition section that adds data output from said multiplication section to the pattern data and inputs the added data into said digital-analog converting section.

The arbitrary waveform generator may further include a selecting section that selects either of the pattern data output from said waveform pattern generating section or the pattern data corrected by said correction processing section and inputs the selected data into said digital-analog converting section.

The arbitrary waveform generator may further include a primary low-pass filter that removes noises from the arbitrary waveform output from said digital-analog converting section, when the arbitrary waveform passes through said primary low-pass filter to be output, the correction processing section may correct the pattern data based on a time constant of said primary low-pass filter, and the selecting section may select the pattern data corrected by said correction processing section.

According to the second aspect of the present invention, there is provided a testing apparatus that tests a device under test. The testing apparatus includes: an arbitrary waveform generator that generates a test signal to be input into the device under test; and a decider that decides the good or bad of the device under test based on an output signal output from the device under test, in which the arbitrary waveform generator includes: a waveform pattern generating section that generates pattern data showing a pattern of an arbitrary waveform; a digital-analog converting section that outputs the arbitrary waveform based on the pattern data; and a correction processing section that corrects the pattern data and inputs the corrected data into said digital-analog converting section based on a value made by differentiating the pattern data and a time constant of a path through which the arbitrary waveform output from said digital-analog converting section passes.

According to the third aspect of the present invention, there is provided an arbitrary waveform generating method for generating an arbitrary waveform. The method includes: a waveform pattern generating step of generating pattern data showing a pattern of the arbitrary waveform; a digital-analog converting step of outputting the arbitrary waveform based on the pattern data; and a correction processing step of correcting the pattern data and inputting the corrected data into said digital-analog converting step based on a value made by differentiating the pattern data and a time constant of a path through which the arbitrary waveform output in said digital-analog converting step passes.

According to the fourth aspect of the present invention, there is provided a program making an arbitrary waveform generator that generates an arbitrary waveform function as:

a waveform pattern generating section that generates pattern data showing a pattern of the arbitrary waveform; a digital-analog converting section that outputs the arbitrary waveform based on the pattern data; and a correction processing section that corrects the pattern data and inputs the corrected data into said digital-analog converting section based on a value made by differentiating the pattern data and a time constant of a path through which the arbitrary waveform output from said digital-analog converting section passes.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
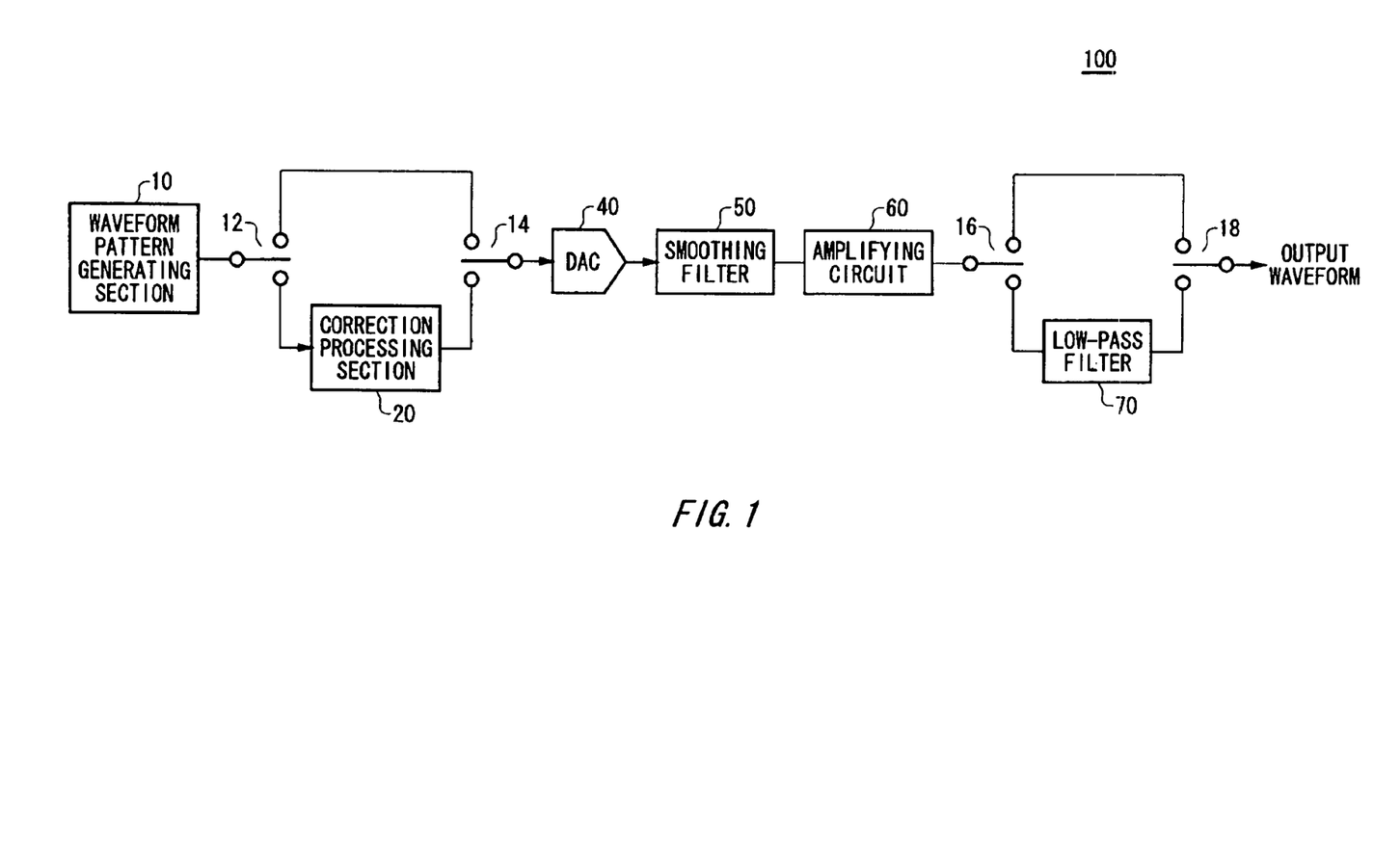
FIG. 1 is a view exemplary showing a configuration of an arbitrary waveform generator according to an embodiment of the present invention.

FIG. 1 is a view exemplary showing a configuration of an arbitrary waveform generator 100 according to an embodiment of the present invention. The arbitrary waveform generator 100 is an apparatus for generating a signal having a desired waveform, and includes a waveform pattern generating section 10, switches 12 and 14, a correction processing section 20, a DAC 40, a smoothing filter 50, an amplifying circuit 60, switches 16 and 18, and a low-pass filter 70.

The waveform pattern generating section 10 generates pattern data showing a pattern of an arbitrary waveform. The waveform pattern generating section 10 may be generate pattern data according to a given program, or may be a memory for previously storing and outputting pattern data.

The DAC 40 outputs an arbitrary waveform based on pattern data output from the waveform pattern generating section 10. The smoothing filter 50 removes a high-frequency component from the arbitrary waveform output from the DAC 40. The amplifying circuit 60 amplifies a signal level of a signal output from the smoothing filter 50 at a predetermined amplification factor, and outputs the amplified signal.

The low-pass filter 70 removes noises from the signal output from the amplifying circuit 60. The low-pass filter 70 is, e.g., a primary filter having a resistor and a capacitor. By such a configuration, a signal having a desired waveform is generated. However, a signal passing through the smoothing filter 50 or the low-pass filter 70 has a distorted waveform according to a frequency characteristic of these filters.

The correction processing section 20 is provided between the waveform pattern generating section 10 and the DAC 40, and corrects the pattern data output from the waveform pattern generating section 10 in order to compensate the distortion of waveform. By such a configuration, an arbitrary waveform with low noises and distortion is generated. The arbitrary waveform generator 100 may be a combination of an operational unit having functions of the waveform pattern generating section 10 and the correction processing section 20 and a waveform generator for generating a waveform according to data received from the operational unit. In this case, the waveform generator may use a well-known apparatus. Moreover, operations in the correction processing section 20 may be realized by hardware or may be realized by software.

Moreover, the switches 12 and 14 function as a selecting section that switches whether the pattern data output from the waveform pattern generating section 10 is input to the DAC 40 via the correction processing section 20 or without via the correction processing section 20. For example, when a signal output from the arbitrary waveform generator 100 permits the distortion of a waveform by the smoothing filter 50 and the low-pass filter 70, the switches 12 and 14 input the pattern data output from the waveform pattern generating section 10 to the DAC 40 without via the correction processing section 20.

Moreover, the switches 16 and 18 function as a selecting section that switches whether a signal output from the amplifying circuit 60 is output to the outside via the low-pass filter 70 or without via the low-pass filter 70. For example, when a signal output from the arbitrary waveform generator 100 permits noises, the switches 16 and 18 output pattern data output from the amplifying circuit 60 to the outside without via the low-pass filter 70.

Moreover, when the switches 16 and 18 select a path passing through the low-pass filter 70, the switches 12 and 14 may select a path passing through the correction processing section 20. For example, when the distortion of waveform in the smoothing filter 50 is small enough, the distortion by a time constant of the low-pass filter 70 becomes a problem. In this case, it is possible to efficiently correct pattern data by controlling the switches 12 and 14 in conjunction with the switches 16 and 18.

Moreover, the arbitrary waveform generator 100 may change a characteristic of the smoothing filter 50 according to a use of output signals. For example, the arbitrary waveform generator 100 may have a plurality of smoothing filters 50 with a characteristic different from one another and select which of the smoothing filters 50 is used as usage.

Figure 2A:
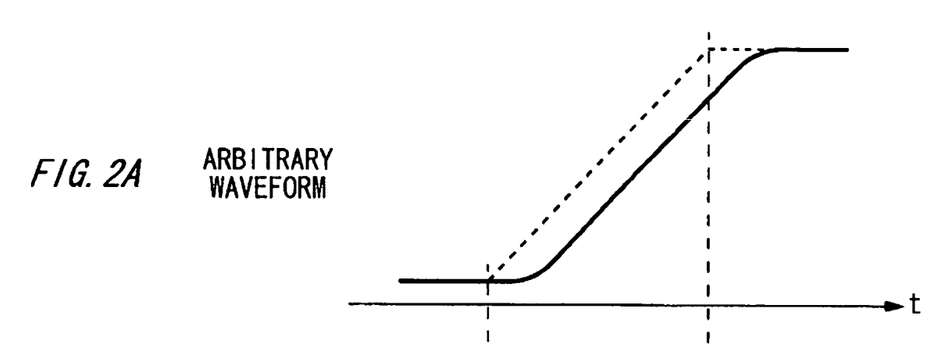
FIG. 2A is a view exemplary showing an arbitrary waveform output from a DAC.
Figure 2B:
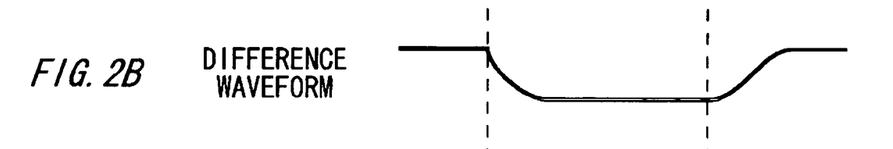
FIG. 2B is a view showing a difference waveform between a waveform being input into a path such as a filter and a waveform being output from a path such as a filter.
Figure 2C:
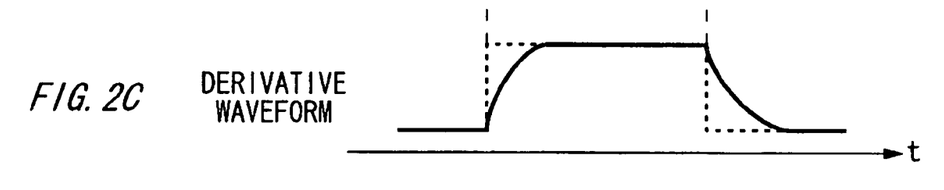
FIG. 2C is a view showing a waveform made by differentiating an arbitrary waveform being input into a path such as a filter.

FIGS. 2A to 2C are views explaining the distortion of signal output from a filter or the like. FIG. 2A is a view exemplary showing an arbitrary waveform output from the DAC 40. In FIG. 2, an arbitrary waveform input into a filter is shown with a dashed line and a waveform output from a filter is shown with a solid line.

As shown in FIG. 2A, an edge portion of an arbitrary waveform has a high-frequency component at starting and end points of the edge. For this reason, a waveform passing through a path having a frequency characteristic such as a filter gets dull at starting and end points of an edge as shown in FIG. 2A according to this frequency characteristic.

FIG. 2B is a view showing a difference waveform between a waveform being input into a path such as a filter and a waveform being output from a path such as a filter. A waveform being output from a path such as a filter has an error as shown in FIG. 2B in comparison with a waveform being input into a path such as a filter. Amplitude of this difference waveform is determined by a value made by multiplying an inclination of this edge by a time constant of a path such as a filter.

FIG. 2C is a view showing a waveform made by differentiating an arbitrary waveform being input into a path such as a filter. In FIG. 2C, a derivative waveform is shown with a dashed line and a derivative waveform when passing through a path such as a filter is shown with a solid line. As shown in FIG. 2C, a derivative waveform passing through a path such as a filter is generally identical with a waveform made by reversing the difference waveform shown in FIG. 2B. That is to say, it is possible to compensate for distortion of a waveform in a path such as a filter by previously overlapping this derivative waveform on an arbitrary waveform and inputting the overlapped waveform into the path such as the filter.

The correction processing section 20 shown in FIG. 1 receives pattern data output from the waveform pattern generating section 10 and differentiates the pattern data. Then, the correction processing section 20 corrects the pattern data based on a value made by differentiating the pattern data and a time constant of a path through which an arbitrary waveform passes, and inputs the corrected data into the DAC 40. For example, the correction processing section 20 corrects the pattern data based on the derivative value and time constants of the smoothing filter 50 and the low-pass filter 70. The correction processing section 20 may be previously supplied with a time constant of this path, or may be supplied with a time constant of the low-pass filter 70.

For example, when the switches 16 and 18 select a path passing through the low-pass filter 70, the correction processing section 20 may correct pattern data based on a time constant of the low-pass filter 70. In this case, the switches 12 and 14 select a path passing through the correction processing section 20.

Figure 3:
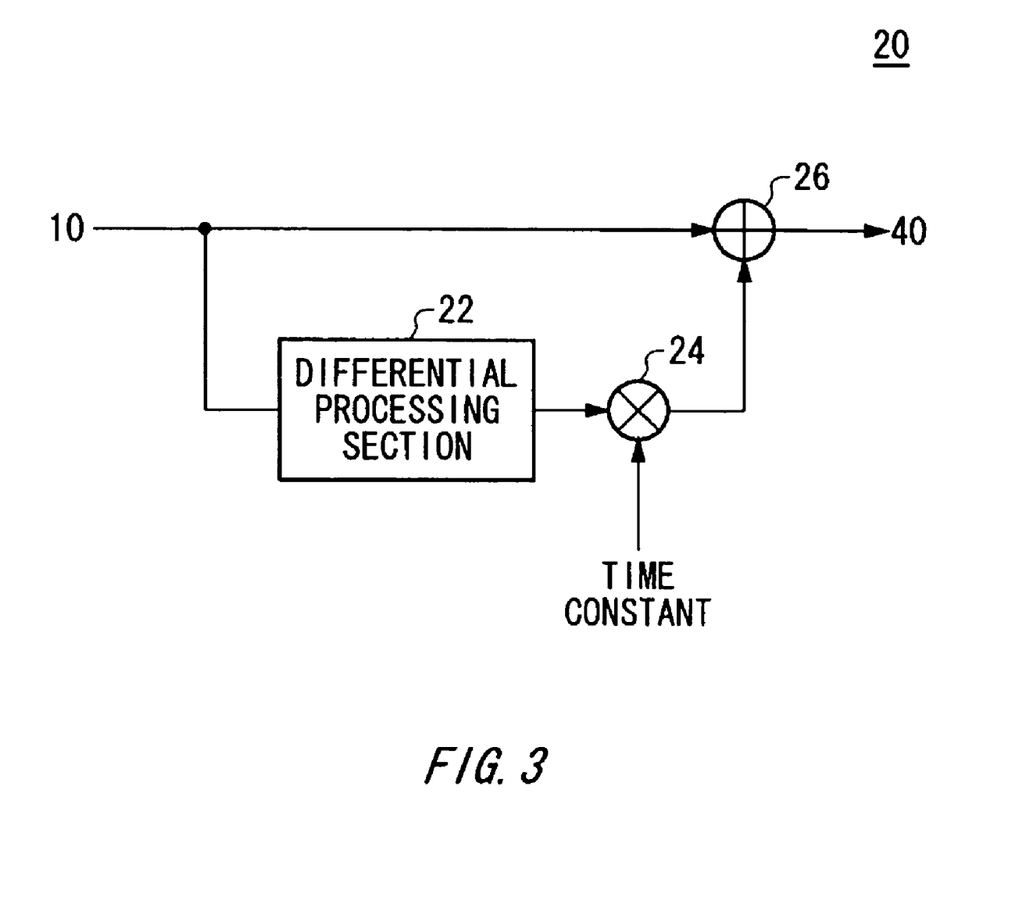
FIG. 3 is a view exemplary showing a configuration of a correction processing section.

FIG. 3 is a view exemplary showing a configuration of the correction processing section 20. The correction processing section 20 has a differential processing section 22, a multiplication section 24, and an addition section 26. The differential processing section 22 receives the pattern data output from the waveform pattern generating section 10 and differentiates this pattern data.

The multiplication section 24 multiplies a time constant of a path through which an arbitrary waveform passes by data output from the differential processing section 22. The data output from the multiplication section 24 is data showing a pattern of the derivative waveform shown in FIG. 2C. The addition section 26 adds the data output from the multiplication section 24 to the pattern data output from the waveform pattern generating section 10 and inputs the added data into the DAC 40. It is preferable that the addition section 26 receives the pattern data output from the waveform pattern generating section 10 and the data output from the multi-plication section 24 in synchronization with each other. By such a configuration, it is possible to generate pattern data of which waveform distortion in a filter or the like is previously compensated for.

Figure 4A:
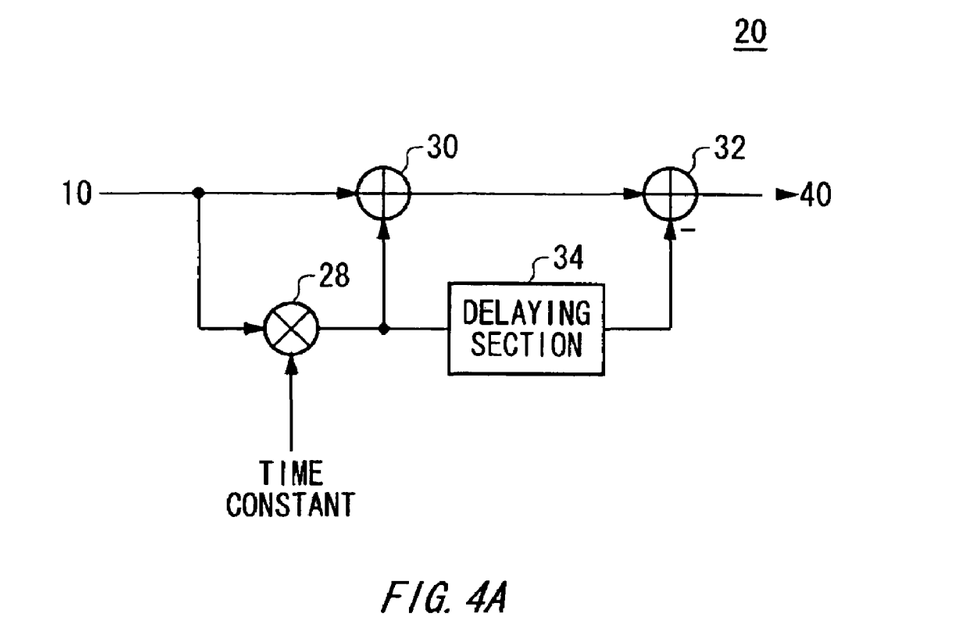
FIG. 4A is a view exemplary showing a circuit configuration of a correction processing section.
Figure 4B:
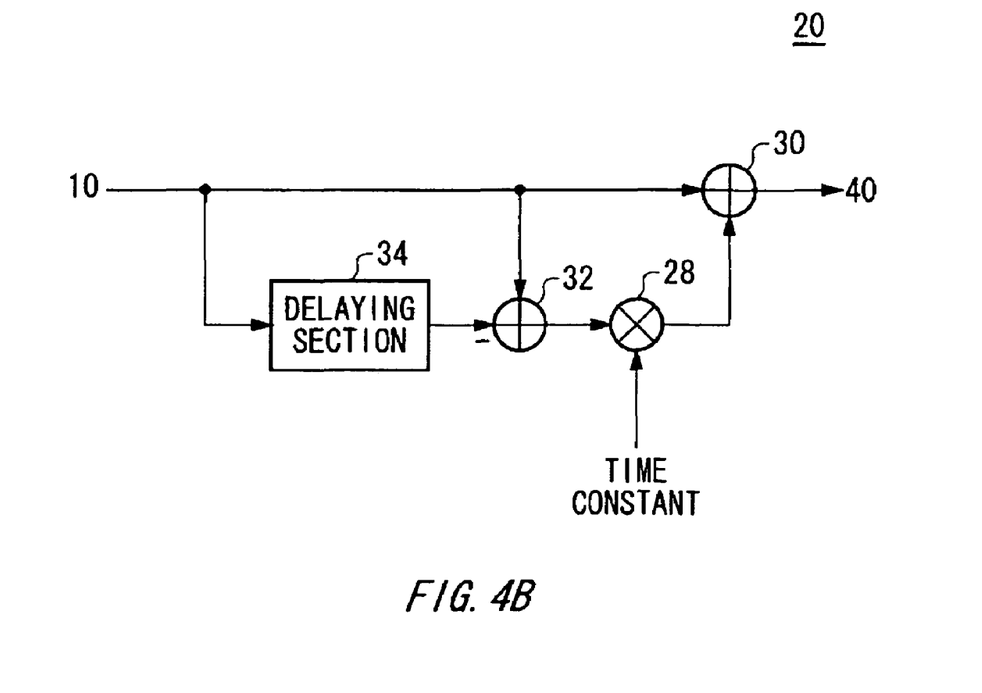
FIG. 4B is a view exemplary showing a circuit configuration of a correction processing section.

FIGS. 4A and 4B are views exemplary showing a circuit configuration of the correction processing section 20. The correction processing section 20 in the present example has a multiplication section 28, an addition section 30, a subtraction section 32, and a delaying section 34. In the correction processing section 20 shown in FIG. 4A, the multiplication section 28 multiplies, e.g., a time constant of the low-pass filter 70 by the pattern data output from the waveform pattern generating section 10. Moreover, the multiplication section 28 may multiply a correction coefficient, which is obtained by multiplying sampling frequency of the DAC 40 by the time constant, by the pattern data.

The addition section 30 adds the data output from the multiplication section 28 to the pattern data output from the waveform pattern generating section 10. The delaying section 34 delays the data output from the multiplication section 28 by one data period of this pattern data. Then, the subtraction section 32 subtracts the data output from the delaying section 34 from the data output from the addition section 30 and outputs the subtracted data. By such a configuration, it is possible to realize a function of the correction processing section 20 described in FIG. 3.

Moreover, in the correction processing section 20 shown in FIG. 4B, the delaying section 34 delays the pattern data output from the waveform pattern generating section 10 by one data period of the pattern data. Then, the subtraction section 32 subtracts the data output from the delaying section 34 from the pattern data output from the waveform pattern generating section 10. The multiplication section 28 multiplies, e.g., a time constant of the low-pass filter 70 by the data output from the subtraction section 32. Moreover, the addition section 30 adds the data output from the multiplication section 28 to the pattern data output from the waveform pattern generating section 10. By such a configuration, it is also possible to realize a function of the correction processing section 20 described in FIG. 3.

Figure 5:
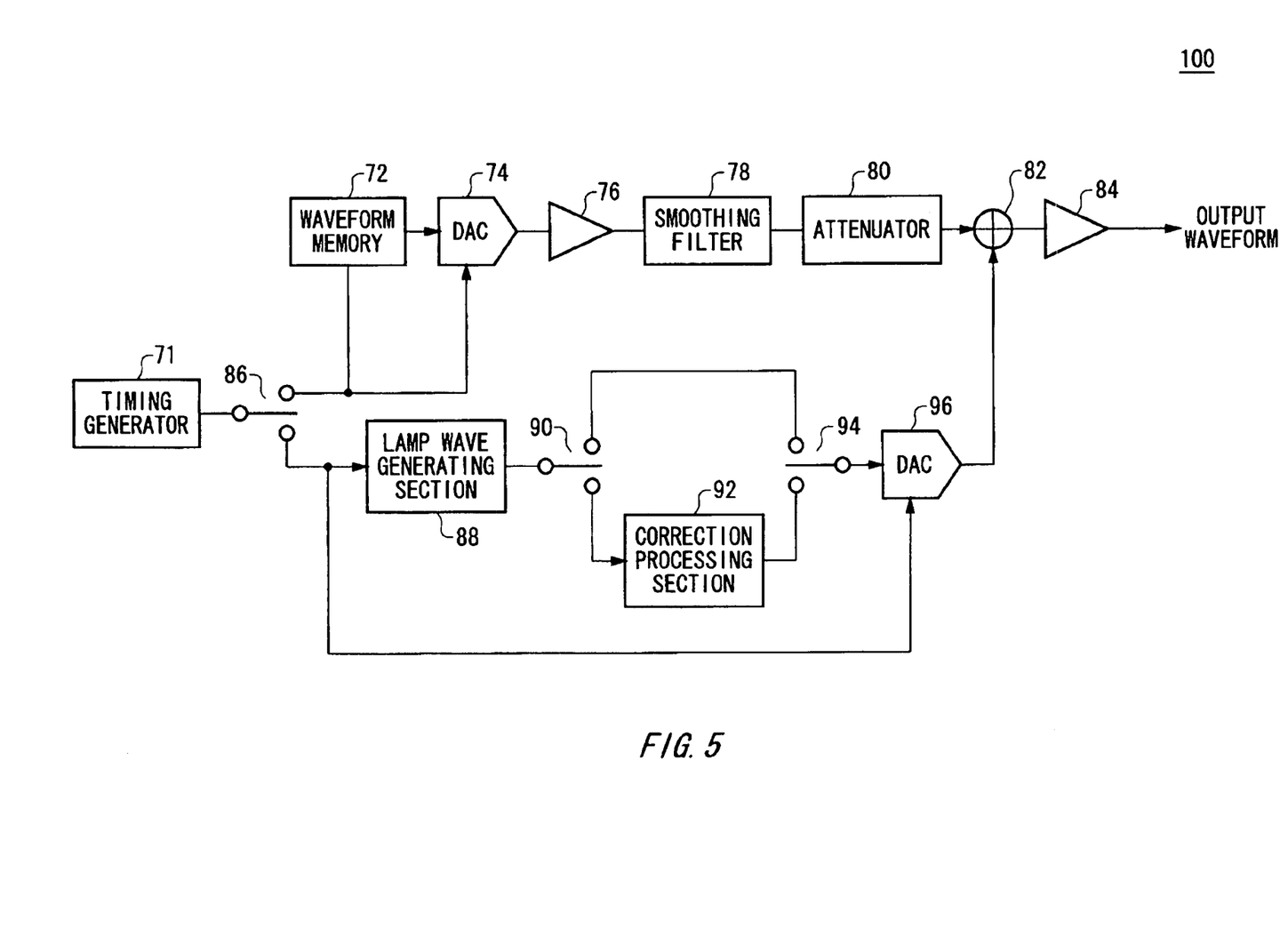
FIG. 5 is a view showing another example of a configuration of an arbitrary waveform generator.

FIG. 5 is a view showing another example of a configuration of an arbitrary waveform generator 100. The arbitrary waveform generator 100 in the present example has an operation mode generating an arbitrary waveform of a desired waveform and an operation mode generating a lamp waveform. The arbitrary waveform generator 100 includes a timing generator 71, a waveform memory 72, a DAC 74, a buffer 76, a smoothing filter 78, an attenuator 80, an addition section 82, a buffer 84, a switch 86, a lamp wave generating section 88, switches 90 and 94, a correction processing section 92, and a DAC 96.

The timing generator 71 generates a reference clock operating the arbitrary waveform generator 100. The waveform memory 72 previously stores pattern data showing a pattern of an arbitrary waveform to be generated. Moreover, the lamp wave generating section 88 generates pattern data showing a pattern of a lamp wave to be generated. The DAC 74 converts the pattern data output from the waveform memory 72 into an analog signal. Moreover, the DAC 96 converts the pattern data output from the lamp wave generating section 88 into an analog signal.

When generating an arbitrary waveform of a desired waveform, the switch 86 supplies a reference clock generated from the timing generator 71 to the waveform memory 72 and the DAC 74. In this case, the waveform memory 72 outputs pattern data according to the reference clock and the DAC 74 outputs an analog signal made by sampling the pattern data according to the reference clock.

The smoothing filter 78 receives the analog signal output from the DAC 74 via the buffer 76. The smoothing filter 78 may be equal to the smoothing filter 50 described with reference to FIG. 1. The attenuator 80 adjusts amplitude of the signal output from the smoothing filter 78 to desired amplitude. Moreover, the DAC 96 generates a predetermined offset voltage. The addition section 82 adds the signal output from the attenuator 80 and the offset voltage output from the DAC 96, and outputs the added one to the outside via the buffer 84.

By such a configuration, an arbitrary waveform is generated. Here, since the DAC 96 generates an offset voltage, the DAC 96 may be a circuit operating at a speed lower than that of the DAC 74. Moreover, the DAC 96 is a circuit with accuracy and resolution higher than those of the DAC 74. Since the DAC 96 may be a circuit operating at a speed lower than that of the DAC 74, the DAC 96 can easily output a signal value with accuracy and resolution higher than those of the DAC 74.

Moreover, when generating a lamp waveform, the switch 86 supplies the reference clock generated from the timing generator 71 to the lamp wave generating section 88 and the DAC 96. The lamp wave generating section 88 outputs pattern data according to this reference clock. The switches 90 and 94 and the correction processing section 92 are equal to the switches 12 and 14 and the correction processing section 20 described with reference to FIG. 1. The correction processing section 20 in the present example may be supplied with, e.g., a time constant of a path after the buffer 84. Moreover, when removing noises by means of a low-pass filter in a subsequent stage of the buffer 84, the correction processing section 20 may be also supplied with a time constant of this low-pass filter.

The DAC 96 outputs an analog signal made by sampling pattern data according to the reference clock. The analog signal output from the DAC 96 is output to the outside via the addition section 82 and the buffer 84.

By such a configuration, it is possible to generate an arbitrary waveform by means of the high-speed DAC 74 and generate a lamp waveform with high accuracy and resolution by means of the DAC 96 for generating an offset voltage with an arbitrary waveform. Moreover, it is possible to generate a lamp waveform with smaller distortion by using the correction processing section 92.

Figure 6:
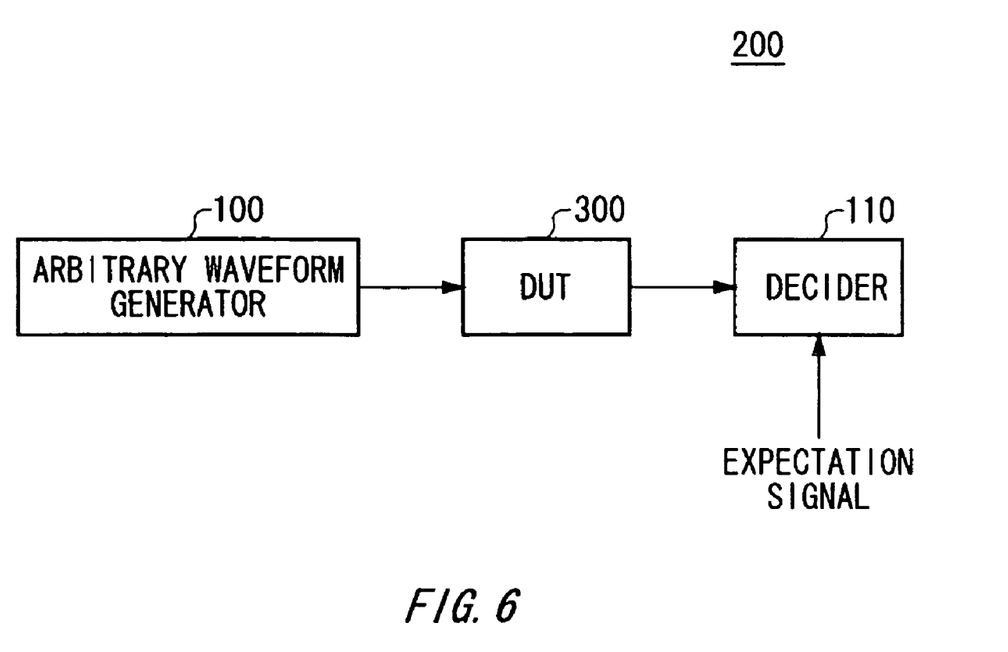
FIG. 6 is a view exemplary showing a configuration of a testing apparatus according to an embodiment of the present invention.

FIG. 6 is a view exemplary showing a configuration of the testing apparatus 200 according to an embodiment of the present invention. The testing apparatus 200 is an apparatus for testing the device under test 300, and includes an arbitrary waveform generator 100 and a decider 110.

The arbitrary waveform generator 100 is equal to the arbitrary waveform generator 100 described in FIGS. 1 to 5. The arbitrary waveform generator 100 generates a test signal having an arbitrary waveform and inputs the signal to the device under test 300.

The decider 110 decides the good or bad of the device under test 300 based on an output signal output from the device under test 300 according to the test signal. For example, the decider 110 may decide the good or bad of the device under test 300 by comparing a given expectation signal and this output signal.

According to the testing apparatus 200 in the present example, since a test signal with low noises and distortion can be generated, it is possible to decide the good or bad of the device under test 300 with high precision.

Figure 7:
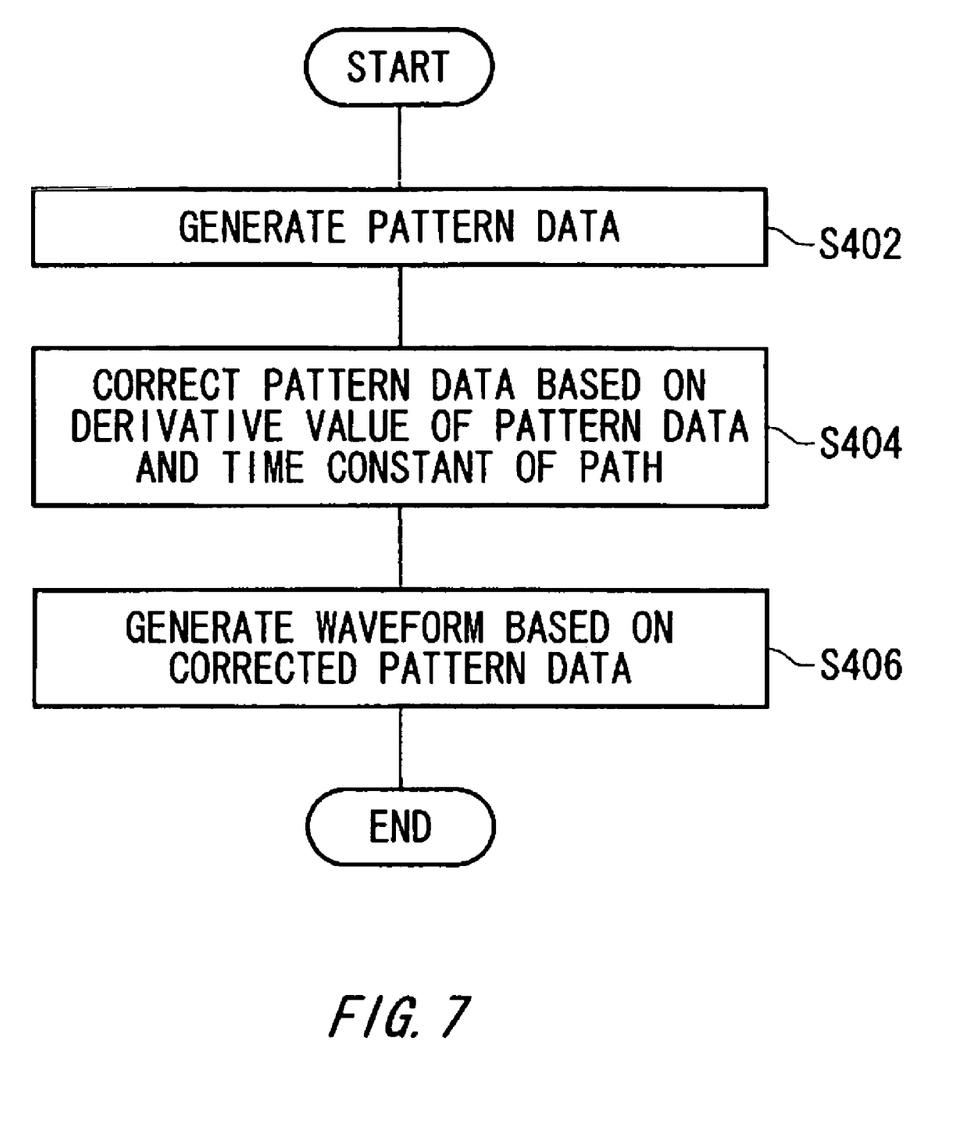
FIG. 7 is a flowchart exemplary showing an arbitrary waveform generating method according to an embodiment of the present invention.

FIG. 7 is a flowchart exemplary showing an arbitrary waveform generating method according to an embodiment of the present invention. First, in a waveform pattern generating step S402, pattern data showing a pattern of an arbitrary waveform is generated. In the waveform pattern generating step S402, pattern data may be generated by means of the waveform pattern generating section 10 described with reference to FIG. 1.

Next, in a correction processing step S404, the pattern data is corrected based on a value made by differentiating the pattern data and a time constant of a path through which the arbitrary waveform passes. In the correction processing step S404, a correction process may be performed by means of the correction processing section 20 described with reference to FIG. 1. In other words, in the correction processing step S404, in order to compensate for distortion of this waveform by a time constant of a path through which an arbitrary waveform passes, pattern data is previously corrected.

Then, in the digital-to-analog converting step S406, an arbitrary waveform is output based on the corrected pattern data. In the digital-to-analog converting step S406, an arbitrary waveform may be output by means of the DAC 40 described with reference to FIG. 1. By such steps, it is possible to generate an arbitrary waveform with low noises and distortion.

Figure 8:
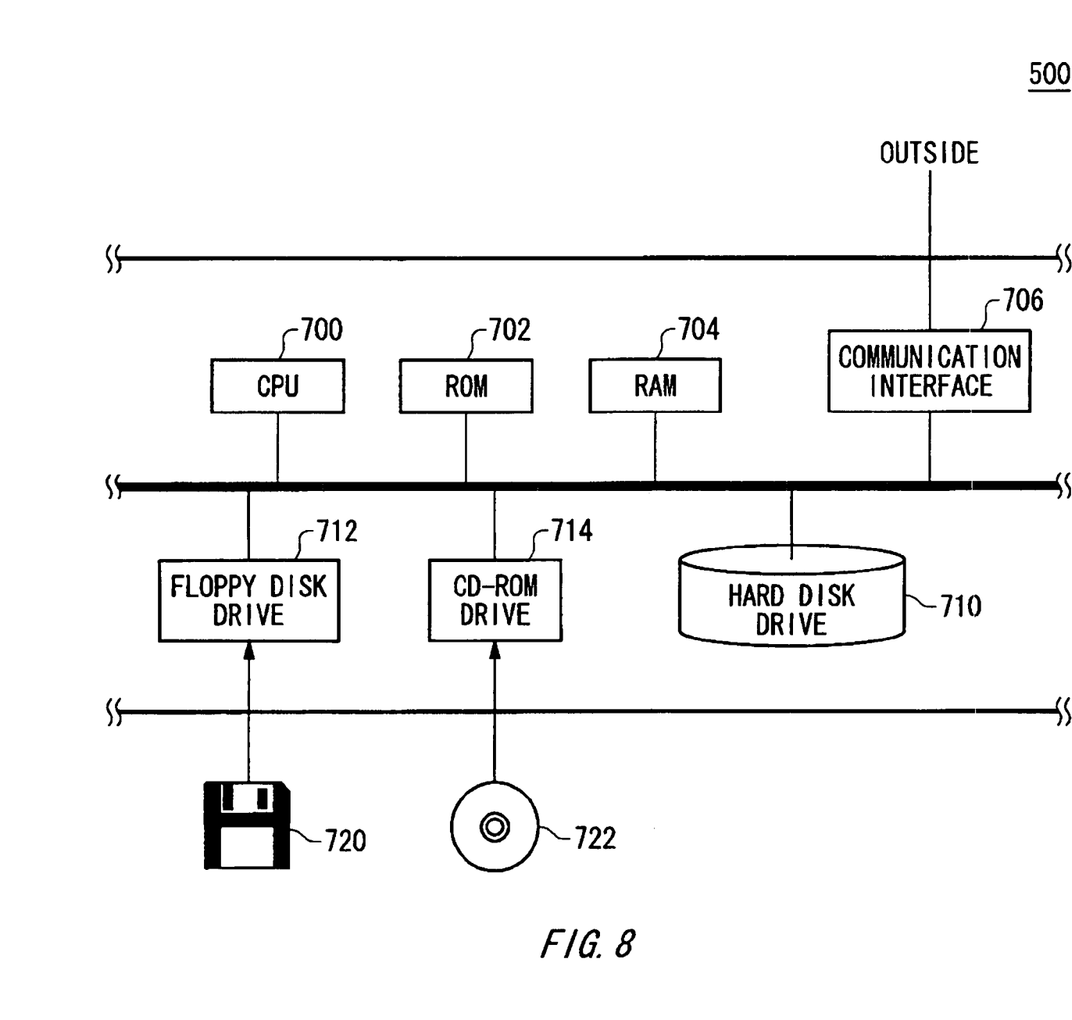
FIG. 8 is a view exemplary showing a configuration of a computer functioning as an arbitrary waveform generator.

FIG. 8 is a view exemplary showing a configuration of a computer 500 functioning as the arbitrary waveform generator 100. In the present example, the computer 500 stores a program making the arbitrary waveform generator 100 function as described in FIGS. 1 to 6. The computer 500 includes a CPU 700, a ROM 702, a RAM 704, a communication interface 706, a hard disk drive 710, a floppy disk drive 712, and a the RAM 704, a hard disk 710, a floppy disk 714, and/or a CD-ROM 718.

For example, the program may make the arbitrary waveform generator 100 function as the waveform pattern generating section 10, the switches 12 and 14, the correction processing section 20, the DAC 40, the smoothing filter 50, the amplifying circuit 60, the switches 16 and 18, and the low-pass filter 70, which are described with reference to FIGS. 1 to 6. Moreover, the computer 500 may function as the waveform pattern generating section 10 and the correction processing section 20 based on this program.

The communication interface 706 communicates with, e.g., the arbitrary waveform generator 100 and controls the arbitrary waveform generator 100. Moreover, when the computer 500 functions as the waveform pattern generating section 10 and the correction processing section 20, the communication interface 706 may communicate with a well-known waveform generator to make this waveform generator function as the DAC 40, the smoothing filter 50, the amplifying circuit 60, the switches 16 and 18, and the low-pass filter 70.

The hard disk drive 710 that is an example of storage device stores configuration information and a program operating the CPU 700. The ROM 702, the RAM 704, and/or the hard disk drive 710 store a program making the arbitrary waveform generator 100 function as the arbitrary waveform generator 100 described with reference to FIGS. 1 to 6. Moreover, this program may be stored on the flexible disk 720, the CD-ROM 722, the hard disk drive 710, or the like.

The floppy disk drive 712 reads the program from the flexible disk 714 and provides the read program to the CPU 700. The CD-ROM drive 716 reads the program from the CD-ROM 718 and provides the read program to the CPU 700.

Moreover, a program may be directly read from a recording medium to a RAM to be executed, or may be read to a RAM to be executed after being once installed in a hard disk drive. Furthermore, the program may be stored on a single recording medium, or may be stored on a plurality of recording media. Moreover, a program stored on a recording medium may provide each function jointly with an operating system. For example, a program may request an operating system to perform a part or the whole of a function and provide the function based on a response from the operating system.

A recording medium storing a program can include an optical recording medium such as a DVD or a PD, a magneto-optical recording medium such as an MD, a tape medium, a magnetic recording medium, a semiconductor memory such as an IC card or a miniature card, in addition to a flexible disk and a CD-ROM. Moreover, a storage device such as a hard disk or a RAM provided in a server system connected to a private communication network and Internet may be used as a recording medium.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to compensate for distortion of an arbitrary waveform in a low-pass filter when using the low-pass filter in order to remove noises from the arbitrary waveform.

What is claimed is:

1. An arbitrary waveform generator that generates an arbitrary waveform, comprising:
   a waveform pattern generating section that generates pattern data showing a pattern of the arbitrary waveform;
   a digital-analog converting section that outputs the arbitrary waveform based on the pattern data; and
   a correction processing section that corrects the pattern data and inputs the corrected data into said digital-analog converting section based on a value made by differentiating the pattern data and a time constant of a path through which the arbitrary waveform output from said digital-analog converting section passes.

2. The arbitrary waveform generator as claimed in claim 1, wherein said correction processing section comprises:
   a differential processing section that differentiates the pattern data; a multiplication section that multiplies the time constant by data output from said differential processing section; and
   an addition section that adds data output from said multiplication section to the pattern data and inputs the added data into said digital-analog converting section.

3. The arbitrary waveform generator as claimed in claim 1, further comprising a selecting section that selects either of the pattern data output from said waveform pattern generating section or the pattern data corrected by said correction processing section and inputs the selected data into said digital-analog converting section.

4. The arbitrary waveform generator as claimed in claim 3, wherein the arbitrary waveform generator further comprises a primary low-pass filter that removes noises from the arbitrary waveform output from said digital-analog converting section, when the arbitrary waveform passes through said primary low-pass filter to be output, said correction processing section corrects the pattern data based on a time constant of said primary low-pass filter, and said selecting section selects the pattern data corrected by said correction processing section.

5. A testing apparatus that tests a device under test, comprising:
   an arbitrary waveform generator that generates a test signal to be input into the device under test; and
   a decider that decides the good or bad of the device under test based on an output signal output from the device under test,
   wherein said arbitrary waveform generator comprises:
      a waveform pattern generating section that generates pattern data showing a pattern of an arbitrary waveform;
      a digital-analog converting section that outputs the arbitrary waveform based on the pattern data; and
      a correction processing section that corrects the pattern data and inputs the corrected data into said digital-analog converting section based on a value made by differentiating the pattern data and a time constant of a path through which the arbitrary waveform output from said digital-analog converting section passes.

6. An arbitrary waveform generating method for generating an arbitrary waveform, comprising:
   a waveform pattern generating step of generating pattern data showing a pattern of the arbitrary waveform;
   a digital-analog converting step of outputting the arbitrary waveform based on the pattern data; and
   a correction processing step of correcting the pattern data and inputting the corrected data into said digital-analog converting step based on a value made by differentiating the pattern data and a time constant of a path through which the arbitrary waveform output in said digital-analog converting step passes.

7. A recording medium storing thereon a program making an arbitrary waveform generator that generates an arbitrary waveform function as:
   a waveform pattern generating section that generates pattern data showing a pattern of the arbitrary waveform;
   a digital-analog converting section that outputs the arbitrary waveform based on the pattern data; and
   a correction processing section that corrects the pattern data and inputs the corrected data into said digital-analog converting section based on a value made by differentiating the pattern data and a time constant of a path through which the arbitrary waveform output from said digital-analog converting section passes.

* * * * *